United States Patent [19]

Hosoda et al.

[11] Patent Number: 5,071,619
[45] Date of Patent: * Dec. 10, 1991

[54] FINE GOLD ALLOY WIRE FOR BONDING OF A SEMICONDUCTOR DEVICE

[75] Inventors: Naoyuki Hosoda; Masayuki Tanaka; Tamotsu Mori, all of Sanda, Japan

[73] Assignee: Mitsubishi Kinzoku Kabushiki Kaisha, Tokyo, Japan

[*] Notice: The portion of the term of this patent subsequent to Dec. 5, 2006 has been disclaimed.

[21] Appl. No.: 445,542

[22] Filed: Dec. 4, 1989

Related U.S. Application Data

[60] Division of Ser. No. 296,350, Jan. 9, 1989, Pat. No. 4,885,135, which is a continuation of Ser. No. 825,942, Feb. 3, 1986, abandoned, which is a continuation of Ser. No. 586,642, Mar. 7, 1984, abandoned, which is a continuation-in-part of Ser. No. 419,840, Sep. 20, 1982, abandoned.

[30] Foreign Application Priority Data

Dec. 4, 1981 [JP] Japan .................................. 56-195299
Mar. 10, 1982 [JP] Japan .................................. 57-37580

[51] Int. Cl.$^5$ ................................................ C22C 5/02
[52] U.S. Cl. ...................................... 420/507; 428/606
[58] Field of Search ............. 420/507, 508, 509, 510, 420/511, 512, 416; 428/606; 200/266; 252/514

[56] References Cited

U.S. PATENT DOCUMENTS

| 3,211,550 | 10/1965 | Bernstein | 420/507 |
| 3,667,937 | 6/1972 | Ingersoll | 420/507 |
| 4,018,599 | 4/1977 | Hill et al. | 420/507 |
| 4,080,485 | 3/1978 | Bonkonara | 420/620 |
| 4,180,700 | 12/1979 | Kraska | 420/507 |
| 4,217,137 | 8/1980 | Kraska | 420/507 |
| 4,374,668 | 2/1983 | Desai | 420/507 |
| 4,387,073 | 6/1983 | Westbrook | 420/507 |
| 4,938,923 | 7/1990 | Kujiraoka et al. | 420/509 |

FOREIGN PATENT DOCUMENTS

| 1608161 | 9/1970 | Fed. Rep. of Germany | 420/507 |
| 2741277 | 3/1979 | Fed. Rep. of Germany | 420/508 |
| 105968 | 9/1978 | Japan | 420/507 |
| 112060 | 9/1978 | Japan | 420/507 |
| 13740 | 2/1981 | Japan | 420/510 |
| 19629 | 2/1981 | Japan | 420/507 |
| 30731 | 3/1981 | Japan | 420/507 |
| 49534 | 5/1981 | Japan | 420/510 |
| 49535 | 5/1981 | Japan | 420/507 |
| 96741 | 6/1983 | Japan | 420/507 |

Primary Examiner—John J. Zimmerman
Attorney, Agent, or Firm—Frishauf, Holtz, Goodman & Woodward

[57] ABSTRACT

A fine gold alloy wire of high tensile strength for bonding semiconductor elements is disclosed. The wire consists essentially of 0.0003 to 0.010 wt % of at least one rare earth element selected from the group consisting of La, Ce, Pr, Nd, Sm, Eu, Gd, Tb, Dy, Ho, Er, Tm, Yb, Lu, Sc and Y, the balance being Au and incidental impurities. The wire does not present a deformed loop and has greater bond strength if it contains 0.0003 to 0.010 wt % of at least one rare earth element of the Cerium Group selected from the group consisting of La, Ce, Pr, Nd and Sm and 0.0001 to 0.0060 wt % of at least one element selected from among Ge, Be and Ca.

58 Claims, No Drawings

FINE GOLD ALLOY WIRE FOR BONDING OF A SEMICONDUCTOR DEVICE

This is a division of application Ser. No. 07/296,350 filed Jan. 9, 1989, now U.S. Pat. No. 4,885,135 which is a continuation of Ser. No. 06/825,942 filed Feb. 3, 1986 (abandoned); which is a continuation of Ser. No. 06/586,642 filed Mar. 7, 1984 (abandoned); which is a CIP of Ser. No. 06/419,840 filed Sept. 20, 1982 (abandoned).

TECHNICAL FIELD

The present invention relates to a fine gold alloy wire having high tensile strength both at room temperature and high temperatures and which is suitable for use in wire-bonding a semiconductor device to a lead frame.

BACKGROUND ART

In fabricating semiconductor devices such as transistors, ICs and LSIs, electrodes on a chip are connected to external leads by gold wires. Semiconductor devices are typically fabricated by the following steps:

(a) prepare a lead material from a strip of Cu or Cu alloy or Ni or Ni alloy having a thickness of 0.1 to 0.3 mm;

(b) stamp out a lead frame conforming to the shape of the semiconductor device to be fabricated;

(c) apply high-purity Si or Ge semiconductor elements to selected areas of the lead frame by thermocompression with an electrically conductive resin such as Ag paste or through a plating of Au, Ag, Ni or their alloy formed on one surface of the lead material;

(d) connect the semiconductor elements to the lead frame by gold wires (this is a bonding step);

(e) enclose with a protective plastic package the semiconductor elements, gold wires and parts of the lead frame to which the semiconductor elements have been bonded;

(f) remove unnecessary parts from the lead frame to form discrete leads; and (g) apply a soldering material to the legs of the leads to enable connection of the semiconductor device to the substrate.

In the bonding step (d), the gold wire is fixed sequentially at the proper points of the semiconductor elements and the lead frame (kept at 150°-300° C.) by a manual or automatic bonding machine. That is, first, the gold wire is heated at its tip with an oxy-hydrogen flame or by electrical means to let it take the form of a ball, which is pressed against the semiconductor, then an extension of the gold wire is pressed against a point on the lead frame to be fixed thereon and the wire is cut to finish the bonding cycle. Then, this cut end becomes the tip serving as a point to be pressed against the next bonding point on the semiconductor in the subsequent bonding cycle.

As bonding at higher speed and more highly integrated circuits are desired, the use of finer and stronger gold wires is necessary. But the currently used wires are made of pure gold which has a relative low tensile strength at room and high temperatures and cannot be drawn to a smaller diameter of 0.05 mm or less without accompanying frequent breakage of the wire, and even if pure gold could be drawn into wires that fine, they would often break during the bonding step. What is more, because of the low softening point of pure gold, the crystal grains of the wire being cut with a flame or by electrical means recrystallize to become bigger and brittle, and when the gold ball is pressed at between 150° and 300° C., the bonded wire softens to deform the wire loop connecting the semiconductor elements and lead frame and may cause shorting. The pure gold wire also does not have satisfactory bond strength with respect to the semiconductor elements and lead frame.

Gold bonding wires should have the highest possible content of gold in order to make most use of its physical, electrical and chemical properties. However, wires with a gold content of 99.999% or more having a diameter of 50 μm or less have a tensile strength of only 6 to 7 g at room temperature and have a still lower value at elevated temperatures.

Therefore, the primary object of the present invention is to provide a gold wire which (1) has a very high gold content and (2) is sufficiently protected against increased brittleness and deterioration in other properties, and which (3) claims tensile strength values at room temperature and elevated temperatures which are at least 50% higher than those previously attainable even when the wire is drawn to a diameter of 50 μm or less.

DISCLOSURE OF THE INVENTION

The present invention eliminates the problems of the conventional pure gold bonding wire and provides (1) a gold alloy wire having high tensile strength at either room temperature or high temperature that can be drawn to a diameter as small as 0.05 mm or less and which can be used as a bonding wire without breaking, and (2) a gold alloy wire that provides high bond strength and has a sufficiently high softening point to prevent the formation of brittle coarse crystal grains due to recrystallization and the presence of a deformed loop. The gold alloy wire (1) is characterized by a composition consisting essentially of 0.0003 to 0.010 wt % of at least one rare earth element selected from the group consisting of La, Ce, Pr, Nd, Sm, Eu, Gd, Tb, Dy, Ho, Er, Tm, Yb, Lu, Sc and Y, the balance being Au and incidental impurities. The gold alloy wire (2) is characterized by a composition consisting essentially of 0.0003 to 0.010 wt % of at least one rare earth element of the Cerium Group selected from the group consisting of La, Ce, Pr, Nd and Sm, 0.0001 to 0.0060 wt % of at least one element selected from among Ge, Be and Ca, the balance being Au and incidental impurities.

The criticality of the components of each composition is described below.

(a) Rare Earth Elements

The rare earth elements are equivalent to one another in their ability to increase the tensile strength of the wire at either room temperature or high temperature. If their content is less than 0.0003 wt %, the desired tensile strength at room and high temperatures is not achieved, and if their content exceeds 0.01 wt %, the wire becomes brittle and cannot be smoothly drawn to a smaller size. Therefore, in the present invention, the content of the rare earth elements is between 0.0003 and 0.01 wt %.

Generally, as more rare earth metal is added to the gold wire, its tensile strength for both room temperature and elevated temperatures is increased, and at the same time, its hardness is increased. Wires which are too hard may damage the chip. If the amount of the rare earth metal is excessively great, the gold wire becomes less elastic and forms a loop which is not high enough to prevent contact with the chip edge. Rare earth metals used as dopants are generally highly oxidizable, and if they are used in amounts which are too large, an oxide film forms to prevent strong bonding to contact points on the IC chip. According to the finding of the present inventors, these problems can be eliminated by using not more than 0.01% of a rare earth metal, and this is why the upper limit of a rare earth metal used in the present invention is 0.01%.

In order to meet the two requirements that the gold content be as high as possible and that the desired value of tensile strength be ensured both at room temperature and elevated temperatures, the preferred range of the content of the rare earth metal is between 0.0003% and less than 0.001%.

(b) Ge, Be and Ca

These elements are equivalent to one another in that when combined with rare earth elements of cerium group, they achieve the following advantages: they increase the softening point of the wire to thereby prevent it from becoming brittle during the bonding step and prevent the presence of a deformed loop; they provide increased bond strength; and they further enhance the tensile strength of the wire at room and high temperatures. If the content of these elements is less than 0.0001 wt %, their intended effects are not achieved, and if their content exceeds 0.006 wt %, the wire becomes brittle and cannot be drawn without troubles to a smaller size, and what is more, rupture easily occurs at the grain boundary when the wire is heated to the bonding temperature. Therefore, in the present invention, the content of Ge, Be and Ca is limited to the range of from 0.0001 to 0.006 wt %.

German Patent Publication No. 1608161 published in September 1970 discloses a gold wire having a rare earth metal added to gold. However, in the specific embodiment shown, Ce-Mischmetal is incorporated in an amount of 0.015%, and claim 1 states that a rare earth metal is incorporated in an amount of 0.001 to 0.1% (0.005–0.05% in claim 2). Therefore, the gold content of the wire shown in the embodiment which is supposed to illustrate the best example is not more than 99.985%, and the broadest possible range of the gold content is from 99.999 to 99.9% (claim 1). This shows that for the purposes envisioned in German Patent Publication No. 1608161, the minimum required gold content is 99.9%, and for obtaining the best result, the gold content must be about 99.985%, i.e. the content of rare earth metals is a little less than 0.015%. In other words, the German Patent explicitly shows that a rare earth metal used in an amount of less than 0.001% is entirely ineffective for achieving the purposes of the invention.

If only one example of an invention is shown in the specification, that is supposed to be the best mode of embodiment. The specification of German Patent Publication No. 1608161 shows that 0.015% of Ce-Mischmetal is used in the best mode of embodiment, but by using this amount of Ce-Mischmetal, the gold content of the wire is reduced to 99.985%, and the specification says nothing about the defects which may occur in consequence of this reduction. Apparently, the inventors of the German patent did not recognize at all the importance of maintaining the gold content as high as possible. A wire whose gold content is 99.985% may be stronger than a wire containing 99.99% or more gold. However, there is no doubt that the former type of gold wire loses at least one of the properties we expect from a wire having a very high gold content.

German Patent Publication No. 1608161 gives no answer to the following question: Even if the amount of a rare earth metal is limited to not more than 0.001% in order to maintain the gold content of a wire, will the resulting wire have a significantly improved strength? Claim 2 of this German Patent states that the preferred amount of a rare earth metal to be added to gold ranges from 0.005 to 0.05%, and in the best mode of embodiment, a gold wire consisting of 99.985% of gold and 0.015% of Ce-Meschmetal is shown. This reveals the entire lack of the recognition on the part on the inventors of the German Patent that if the content of a rare earth metal exceeded 0.01%, embrittlement and other defects that are described earlier in this specification would occur.

In short, German Patent Publication No. 1608161 neither shows nor suggests that a gold wire having unexpectedly good properties can be provided by incorporating a trace amount of a rare earth metal while maintaining the gold content of the wire at sufficiently high level. This is the basic idea of the present invention and is by no means obvious from the cited publication. This conclusion may well be justified by the fact that the gold wire shown in German Patent Publication No. 1608161 has not been commercialized although it became known to the public in 1970.

Japanese Patent Laid-Open Nos. 105968/78, 112060/78, 13740/81, 19629/81, 49534/81 and 49535/81 show a wire for bonding a semiconductor device which is made of Au and Ca optionally together with Be and Ge. However, none of these references show a gold wire incorporating a rare earth metal.

EXAMPLES

Gold alloy melts having the compositions indicated in Table 1 were prepared by the conventional melting method. The melts were cast into ingots, which were rolled with a conventional grooved roll mill and drawn to fine wire samples Nos. 1 to 120 of the present invention having a diameter of 0.025 mm. The wire samples were subjected to a room temperature tensile test and a high temperature tensile test using the conditions that simulated the bonding step (temperature: 250° C., dwell time: 30 seconds). The results of each test are indicated in Table 1. Samples Nos. 57 to 120 were used in actual bonding of semiconductor elements to a lead frame, and the bond strength and the presence of a deformed wire loop were checked. The results are also indicated in Table 1. The same tests were conducted on a pure gold wire and the results are shown in Table 1 for the purpose of comparison.

TABLE I

| Wire samples | Composition (wt %, ×10⁻⁵) | | | | | | | | | | | | | | | | | | | | tensile test at room temperatures | | tensile test at high temperatures | | bond strength (g) | deformed loop |
|---|---|---|---|---|---|---|---|---|---|---|---|---|---|---|---|---|---|---|---|---|---|---|---|---|---|---|
| | La | Ce | Pr | Nd | Sm | Eu | Gd | Tb | Dy | Ho | Er | Tm | Yb | Lu | Sc | Y | Ge | Be | Ca | Au + impurities | breaking strength (g) | elongation (%) | breaking strength (g) | elongation (%) | | |
| Au alloy wires of the present invention | | | | | | | | | | | | | | | | | | | | | | | | | | |
| 1 | 40 | | | | | | | | | | | | | | | | | | | bal. | 9.2 | 4 | 8.4 | 2 | | |
| 2 | 430 | | | | | | | | | | | | | | | | | | | " | 13.8 | 4 | 11.9 | 2 | | |
| 3 | 970 | | | | | | | | | | | | | | | | | | | " | 19.1 | 4 | 16.8 | 2 | | |
| 4 | | 60 | | | | | | | | | | | | | | | | | | " | 10.1 | 4 | 8.9 | 2 | | |
| 5 | | 310 | | | | | | | | | | | | | | | | | | " | 12.9 | 4 | 11.2 | 2 | | |
| 6 | | 990 | | | | | | | | | | | | | | | | | | " | 19.5 | 4 | 17.1 | 2 | | |
| 7 | | | 50 | | | | | | | | | | | | | | | | | " | 9.4 | 4 | 8.5 | 2 | | |
| 8 | | | 490 | | | | | | | | | | | | | | | | | " | 14.2 | 4 | 12.1 | 2 | | |
| 9 | | | 950 | | | | | | | | | | | | | | | | | " | 18.8 | 4 | 15.9 | 2 | | |
| 10 | | | | 40 | | | | | | | | | | | | | | | | " | 9.3 | 4 | 8.2 | 2 | | |
| 11 | | | | 440 | | | | | | | | | | | | | | | | " | 13.8 | 4 | 11.9 | 2 | | |
| 12 | | | | 940 | | | | | | | | | | | | | | | | " | 18.3 | 4 | 15.1 | 2 | | |
| 13 | | | | | 40 | | | | | | | | | | | | | | | " | 9.2 | 4 | 8.1 | 2 | | |
| 14 | | | | | 610 | | | | | | | | | | | | | | | " | 14.1 | 4 | 12.0 | 2 | | |
| 15 | | | | | 950 | | | | | | | | | | | | | | | " | 18.1 | 4 | 15.4 | 2 | | |
| 16 | | | | | | 50 | | | | | | | | | | | | | | " | 9.6 | 4 | 8.3 | 2 | | |
| 17 | | | | | | 520 | | | | | | | | | | | | | | " | 13.7 | 4 | 11.5 | 2 | | |
| 18 | | | | | | 940 | | | | | | | | | | | | | | " | 17.6 | 4 | 15.2 | 2 | | |
| 19 | | | | | | | 50 | | | | | | | | | | | | | " | 9.0 | 4 | 7.9 | 2 | | |
| 20 | | | | | | | 440 | | | | | | | | | | | | | " | 13.2 | 4 | 11.3 | 2 | | |
| 21 | | | | | | | 950 | | | | | | | | | | | | | " | 16.8 | 4 | 14.7 | 2 | | |
| 22 | | | | | | | | 40 | | | | | | | | | | | | " | 9.3 | 4 | 8.1 | 2 | | |
| 23 | | | | | | | | 480 | | | | | | | | | | | | " | 13.9 | 4 | 11.5 | 2 | | |
| 24 | | | | | | | | 960 | | | | | | | | | | | | " | 17.4 | 4 | 14.9 | 2 | | |
| 25 | | | | | | | | | 50 | | | | | | | | | | | " | 9.0 | 4 | 7.9 | 2 | | |
| 26 | | | | | | | | | 520 | | | | | | | | | | | " | 13.6 | 4 | 11.4 | 2 | | |
| 27 | | | | | | | | | 950 | | | | | | | | | | | " | 17.1 | 4 | 14.3 | 2 | | |
| 28 | | | | | | | | | | 60 | | | | | | | | | | " | 9.5 | 4 | 8.3 | 2 | | |
| 29 | | | | | | | | | | 330 | | | | | | | | | | " | 12.9 | 4 | 10.6 | 2 | | |
| 30 | | | | | | | | | | 970 | | | | | | | | | | " | 18.3 | 4 | 15.8 | 2 | | |
| 31 | | | | | | | | | | | 40 | | | | | | | | | " | 9.1 | 4 | 8.0 | 2 | | |
| 32 | | | | | | | | | | | 610 | | | | | | | | | " | 14.1 | 4 | 12.3 | 2 | | |
| 33 | | | | | | | | | | | 950 | | | | | | | | | " | 17.5 | 4 | 14.8 | 2 | | |
| 34 | | | | | | | | | | | | 40 | | | | | | | | " | 8.9 | 4 | 7.7 | 2 | | |
| 35 | | | | | | | | | | | | 560 | | | | | | | | " | 13.9 | 4 | 11.9 | 2 | | |
| 36 | | | | | | | | | | | | 960 | | | | | | | | " | 17.3 | 4 | 14.6 | 2 | | |
| 37 | | | | | | | | | | | | | 40 | | | | | | | " | 9.3 | 4 | 8.1 | 2 | | |
| 38 | | | | | | | | | | | | | 240 | | | | | | | " | 12.1 | 4 | 10.3 | 2 | | |
| 39 | | | | | | | | | | | | | 970 | | | | | | | " | 18.6 | 4 | 15.9 | 2 | | |
| 40 | | | | | | | | | | | | | | 40 | | | | | | " | 8.9 | 4 | 7.6 | 2 | | |
| 41 | | | | | | | | | | | | | | 490 | | | | | | " | 14.3 | 4 | 12.5 | 2 | | |
| 42 | | | | | | | | | | | | | | 960 | | | | | | " | 17.9 | 4 | 15.4 | 2 | | |
| 43 | | | | | | | | | | | | | | | 50 | | | | | " | 9.5 | 4 | 8.2 | 2 | | |
| 44 | | | | | | | | | | | | | | | 610 | | | | | " | 14.5 | 4 | 13.1 | 2 | | |
| 45 | | | | | | | | | | | | | | | 980 | | | | | " | 18.9 | 4 | 16.2 | 2 | | |

TABLE 1-continued

| Wire samples | Composition (wt %, ×10⁻⁵) | | | | | | | | | | | | | | | | | | | Au + impurities | tensile test at room temperatures | | tensile test at high temperatures | | bond strength (g) | deformed loop |
|---|---|---|---|---|---|---|---|---|---|---|---|---|---|---|---|---|---|---|---|---|---|---|---|---|---|---|
| | La | Ce | Pr | Nd | Sm | Eu | Gd | Tb | Dy | Ho | Er | Tm | Yb | Lu | Sc | Y | Ge | Be | Ca | | breaking strength (g) | elongation (%) | breaking strength (g) | elongation (%) | | |
| 46 | 10 | | | | | | | | | | | | | | | 40 | | | | " | 8.4 | 4 | 7.3 | 2 | | |
| 47 | 90 | 20 | | | | | | | | | | | | | | 730 | | | | " | 13.7 | 4 | 11.3 | 2 | | |
| 48 | | | 100 | | | | | | | | | | | | | 940 | | | | " | 16.2 | 4 | 13.8 | 2 | | |
| 49 | | | 100 | | | | | | | | | | | | | | | | | " | 9.6 | 4 | 8.2 | 2 | | |
| 50 | | | | 100 | | | | | | | | | | | | | | | | " | 11.5 | 4 | 9.3 | 2 | | |
| 51 | | | | | 30 | | | 30 | | | | | | | | | | | | " | 12.8 | 4 | 10.2 | 2 | | |
| 52 | | | 40 | | 300 | | | | | | | | | | | | | | | " | 13.1 | 4 | 10.4 | 2 | | |
| 53 | | 50 | 480 | | | | 40 | | 30 | | | | | | | | | | | " | 14.4 | 4 | 12.4 | 2 | | |
| 54 | 470 | | | | | 210 | | | | | | | | | | | | | | " | 19.8 | 4 | 17.1 | 2 | | |
| 55 | 470 | | | 50 | | | | 220 | 190 | | | | | | | | | | | " | 19.4 | 4 | 17.0 | 2 | | |
| 56 | | 470 | 190 | | | | | | | 50 | | | | | | | | | | " | 18.7 | 4 | 16.4 | 2 | | |
| 57 | 32 | | | | | | | | 30 | 100 | | 40 | | | | | | | | " | 9.9 | 4 | 8.9 | 2 | 7.0 | none |
| 58 | 525 | | | | | | | | | | | | 70 | 60 | | | | | | " | 14.5 | 4 | 12.5 | 2 | 8.0 | " |
| 59 | 979 | | | | | | | | | | | 40 | | 50 | | | | | | " | 19.8 | 4 | 17.3 | 2 | 9.0 | " |
| 60 | 513 | | | | | | | | | | 30 | | | | | | | | | " | 14.1 | 4 | 12.1 | 2 | 7.5 | " |
| 61 | 520 | | | | | | | | | | 20 | | | | | | | | | " | 14.9 | 4 | 12.9 | 2 | 8.5 | " |
| 62 | 503 | | | | | | | | | | | | | | 110 | 230 | | | | " | 14.3 | 4 | 12.2 | 2 | 7.5 | " |
| 63 | 486 | | | | | | | | | | | | | | 30 | | | | | " | 14.6 | 4 | 12.7 | 2 | 8.0 | " |
| 64 | 501 | | | | | | | | | | | | | | | | 95 | | | " | 15.1 | 4 | 13.0 | 2 | 8.5 | " |
| 65 | 491 | | | | | | | | | | | | | | | | 87 | | | " | 14.3 | 4 | 12.2 | 2 | 7.5 | " |
| 66 | 513 | | | | | | | | | | | | | | | | 85 | | | " | 14.8 | 4 | 12.9 | 2 | 8.5 | " |
| 67 | 509 | | | | | | | | | | | | | | | | 12 | | | " | 15.1 | 4 | 13.2 | 2 | 9.5 | " |
| 68 | | 33 | | | | | | | | | | | | | | | 195 | | | " | 10.6 | 4 | 9.3 | 2 | 7.0 | " |
| 69 | | 428 | 31 | | | | | | | | | | | | | | | 13 | 11 | " | 13.6 | 4 | 11.8 | 2 | 8.0 | " |
| 70 | | 964 | 529 | | | | | | | | | | | | | | | 102 | 98 | " | 19.9 | 4 | 17.5 | 2 | 9.0 | " |
| 71 | | 503 | 984 | | | | | | | | | | | | | | | 199 | 196 | " | 13.1 | 4 | 11.3 | 2 | 7.5 | " |
| 72 | | 496 | 511 | | | | | | | | | | | | | | 101 | | | " | 13.9 | 4 | 12.0 | 2 | 8.5 | " |
| 73 | | 486 | 513 | | | | | | | | | | | | | | 98 | | | " | 13.2 | 4 | 11.4 | 2 | 7.5 | " |
| 74 | | 511 | 496 | | | | | | | | | | | | | | 97 | | | " | 13.7 | 4 | 11.8 | 2 | 8.0 | " |
| 75 | | 591 | 503 | | | | | | | | | | | | | | 13 | | | " | 14.0 | 4 | 12.0 | 2 | 9.0 | " |
| 76 | | 479 | 516 | | | | | | | | | | | | | | 186 | | | " | 13.3 | 4 | 11.5 | 2 | 7.5 | " |
| 77 | | 513 | 503 | | | | | | | | | | | | | | | 12 | 12 | " | 13.9 | 4 | 12.0 | 2 | 8.5 | " |
| 78 | | 499 | 509 | | | | | | | | | | | | | | | 99 | 103 | " | 14.1 | 4 | 12.1 | 2 | 9.5 | " |
| 79 | | | 505 | | | | | | | | | | | | | | | 191 | 194 | " | 9.9 | 4 | 8.9 | 2 | 7.0 | " |
| 80 | | | 515 | | | | | | | | | | | | | | 89 | | | " | 14.6 | 4 | 12.4 | 2 | 8.0 | " |
| 81 | | | | | | | | | | | | | | | | | 87 | | | " | 19.6 | 4 | 16.7 | 2 | 9.0 | " |
| 82 | | | | | | | | | | | | | | | | | 96 | | | " | 13.9 | 4 | 12.0 | 2 | 7.5 | " |
| 83 | | | | | | | | | | | | | | | | | 13 | | | " | 14.5 | 4 | 12.5 | 2 | 8.5 | " |
| 84 | | | | | | | | | | | | | | | | | 194 | | | " | 13.9 | 4 | 12.0 | 2 | 7.5 | " |
| 85 | | | | | | | | | | | | | | | | | | 12 | 11 | " | 14.3 | 4 | 12.3 | 2 | 8.0 | " |
| 86 | | | | | | | | | | | | | | | | | | 106 | 112 | " | 14.7 | 4 | 12.6 | 2 | 8.5 | " |
| 87 | | | | | | | | | | | | | | | | | | 187 | 194 | " | 14.0 | 4 | 12.1 | 2 | 7.5 | " |
| 88 | | | | | | | | | | | | | | | | | | | | " | 14.0 | 4 | 12.4 | 2 | 8.5 | " |
| 89 | | | | | | | | | | | | | | | | | | | | " | 14.8 | 4 | 12.7 | 2 | 9.5 | " |
| 90 | | | | 33 | | | | | | | | | | | | | 86 | | | " | 9.9 | 4 | 8.7 | 2 | 7.5 | " |

TABLE 1-continued

| Wire samples | Composition (wt %, ×10⁻⁵) | | | | | | | | | | | | | | | | | | | | | Au + impurities | tensile test at room temperatures | | tensile test at high temperatures | | bond strength (g) | deformed loop |
|---|---|---|---|---|---|---|---|---|---|---|---|---|---|---|---|---|---|---|---|---|---|---|---|---|---|---|---|---|
| | La | Ce | Pr | Nd | Sm | Eu | Gd | Tb | Dy | Ho | Er | Tm | Yb | Lu | Sc | Y | Ge | Be | Ca | | | | breaking strength (g) | elongation (%) | breaking strength (g) | elongation (%) | | |
| 91 | | | | 495 | | | | | | | | | | | | | 89 | | | | | " | 14.5 | 4 | 12.4 | 2 | 8.0 | " |
| 92 | | | | 975 | | | | | | | | | | | | | 98 | | | | | " | 18.6 | 4 | 15.9 | 2 | 9.0 | " |
| 93 | | | | 486 | | | | | | | | | | | | | 12 | | | | | " | 14.2 | 4 | 12.1 | 2 | 7.5 | " |
| 94 | | | | 465 | | | | | | | | | | | | | 195 | | | | | " | 14.7 | 4 | 12.6 | 2 | 8.5 | " |
| 95 | | | | 473 | | | | | | | | | | | | | | 12 | | | | " | 14.3 | 4 | 12.1 | 2 | 7.5 | " |
| 96 | | | | 456 | | | | | | | | | | | | | | 103 | | | | " | 14.6 | 4 | 12.4 | 2 | 8.0 | " |
| 97 | | | | 492 | | | | | | | | | | | | | | 189 | | | | " | 14.8 | 4 | 12.6 | 2 | 9.0 | " |
| 98 | | | | 507 | | | | | | | | | | | | | | | 13 | | | " | 14.3 | 4 | 12.1 | 2 | 7.5 | " |
| 99 | | | | 504 | | | | | | | | | | | | | | | 110 | | | " | 14.7 | 4 | 12.4 | 2 | 8.5 | " |
| 100 | | | | 512 | | | | | | | | | | | | | | | 192 | | | " | 14.9 | 4 | 12.7 | 2 | 9.5 | " |
| 101 | | | | | 35 | | | | | | | | | | | | | | | | | " | 9.8 | 4 | 8.6 | 2 | 7.0 | " |
| 102 | | | | | 489 | | | | | | | | | | | | | | | | | " | 14.5 | 4 | 12.4 | 2 | 8.0 | " |
| 103 | | | | | 990 | | | | | | | | | | | | | | | | | " | 18.7 | 4 | 15.9 | 2 | 9.0 | " |
| 104 | | | | | 487 | | | | | | | | | | | | 105 | | | | | " | 14.3 | 4 | 12.1 | 2 | 7.5 | " |
| 105 | | | | | 476 | | | | | | | | | | | | 96 | | | | | " | 14.8 | 4 | 12.5 | 2 | 9.0 | " |
| 106 | | | | | 455 | | | | | | | | | | | | 103 | | | | | " | 14.2 | 4 | 12.0 | 2 | 7.5 | " |
| 107 | | | | | 468 | | | | | | | | | | | | 15 | | | | | " | 14.6 | 4 | 12.4 | 2 | 7.5 | " |
| 108 | | | | | 471 | | | | | | | | | | | | 187 | 11 | | | | " | 14.9 | 4 | 12.5 | 2 | 8.5 | " |
| 109 | | | | | 456 | | | | | | | | | | | | | 95 | | | | " | 14.3 | 4 | 12.1 | 2 | 7.5 | " |
| 110 | | | | | 473 | | | | | | | | | | | | | 195 | | | | " | 14.6 | 4 | 12.5 | 2 | 8.5 | " |
| 111 | | | | | 479 | | | | | | | | | | | | | | 16 | | | " | 14.9 | 4 | 12.6 | 2 | 9.5 | " |
| 112 | 315 | | | | | | | | | | | | | | | | | | 97 | | | " | 14.3 | 4 | 12.2 | 2 | 8.5 | " |
| 113 | 225 | | | | | | | | | | | | | | | | | | 187 | | | " | 14.8 | 4 | 12.4 | 2 | 9.0 | " |
| 114 | | 314 | 613 | | | | | | | | | | | | | | 84 | 64 | 156 | | | " | 18.3 | 4 | 15.7 | 2 | 9.0 | " |
| 115 | 236 | | 213 | | | | | | | | | | | | | | | | 51 | | | " | 19.0 | 4 | 16.3 | 2 | 9.5 | " |
| 116 | | 335 | | | 115 | | | | | | | | | | | | 67 | 87 | 58 | | | " | 14.4 | 4 | 12.2 | 2 | 8.5 | " |
| 117 | | 305 | | 152 | 341 | | | | | | | | | | | | 56 | 69 | 49 | | | " | 14.2 | 4 | 12.3 | 2 | 8.5 | " |
| 118 | 103 | | | | | | | | | | | | | | | | 83 | 45 | 29 | | | " | 12.1 | 4 | 10.0 | 2 | 8.5 | " |
| 119 | 112 | 96 | 87 | | 99 | | | | | | | | | | | | 71 | 31 | 27 | | | " | 14.3 | 4 | 12.3 | 2 | 9.5 | " |
| 120 | 28 | 76 | 32 | 45 | 65 | | | | | | | | | | | | 36 78 | 38 | 46 | | | " | 14.1 | 4 | 12.1 | 2 | 9.5 | " |
| pure Au wire | | | | | | | | | | | | | | | | | | | | | | | 6.5 | 4.0 | 3.0 | 5.9 | 1.9 | present |

The data in Table 1 shows that the gold alloy wire samples of the present invention have greater tensile strength at both room and high temperatures than the pure gold wire, and those having Ge, Be or Ca have the additional advantage of significantly increased bond strength and are entirely free from a deformed loop. For these advantages, the gold alloy wire of the present invention can be drawn to a smaller diameter of 0.05 mm or less and can be used for bonding purposes without breaking. By inclusion of Ge, Be or Ca, the softening point of the wire is further increased to eliminate the chance of embrittlement (due to the formation of coarse grains) or occurrence of a deformed loop and achieve a high bond strength between semiconductor elements and lead frame. For these advantages, the present invention is very useful in achieving faster bonding and producing highly integrated circuit components.

What is claimed is:

1. A fine gold alloy wire for use in the bonding of semi-conductor elements characterized by having high tensile strength and consisting essentially of from 0.0003 to less than 0.01 wt % of at least one rare earth element selected from the group consisting of La, Ce, Pr, Nd, Sm, Eu, Gd, Tb, Dy, Ho, Er, Tm, Lu, Sc and Y with the balance being Au and incidental impurities.

2. The fine gold alloy wire of claim 1 wherein said rare earth element is La.

3. The fine gold alloy wire of claim 1 wherein said rare earth element is Ce.

4. The fine gold alloy wire of claim 1 wherein said rare earth element is Pr.

5. The fine gold alloy wire of claim 1 wherein said rare earth element is Nd.

6. The fine gold alloy wire of claim 1 wherein said rare earth element is Sm.

7. The fine gold alloy wire of claim 1 wherein said rare earth elements are La and Ce.

8. The fine gold alloy wire of claim 1 wherein said rare earth elements are La and Pr.

9. The fine gold alloy wire of claim 1 wherein said rare earth elements are Pr and Sm.

10. The fine gold alloy wire of claim 1 wherein said rare earth elements are Ce, Pr, La and Nd.

11. The fine gold alloy wire of claim 1 wherein said rare earth element is La and wherein said additional elements are Ge and Be.

12. The fine gold alloy wire of claim 1 wherein said rare earth element is La and wherein said additional elements are Be and Ca.

13. The fine gold alloy wire of claim 1 wherein said rare earth element is La and wherein said additional elements are Ge and Ca.

14. The fine gold alloy wire of claim 1 wherein said rare earth element is La and wherein said additional elements are Ge, Be and Ca.

15. The fine gold alloy wire of claim 1 wherein said rare earth element is Ce and wherein said additional elements are Ge and Be.

16. The fine gold alloy wire of claim 1 wherein said rare earth element is Ce and wherein said additional elements are Be and Ca.

17. The fine gold alloy wire of claim 1 wherein said rare earth element is Ce and wherein said additional elements are Ge and Ca.

18. The fine gold alloy wire of claim 1 wherein said rare earth element is Ce and wherein said additional elements are Ge, Be and Ca.

19. The fine gold alloy wire of claim 1 wherein said rare earth element is Pr and wherein said additional elements are Ge and Be.

20. The fine gold alloy wire of claim 1 wherein said rare earth element is Pr and wherein said additional elements are Be and Ca.

21. The fine gold alloy wire of claim 1 wherein said rare earth element is Pr and wherein said additional elements are Ge and Ca.

22. The fine gold alloy wire of claim 1 wherein said rare earth element is Pr and wherein said additional elements are Ge Be and Ca.

23. The fine gold alloy wire of claim 1 wherein said rare earth element is Nd and wherein said additional elements are Ge and Be.

24. The fine gold alloy wire of claim 1 wherein said rare earth element is Nd and wherein said additional elements are Be and Ca.

25. The fine gold alloy wire of claim 1 wherein said rare earth element is Nd and wherein said additional elements are Ge and Ca.

26. The fine gold alloy wire of claim 1 wherein said rare earth element is Nd and wherein said additional elements are Ge, Be and Ca.

27. The fine gold alloy wire of claim 1 wherein said rare earth element is Sm and wherein said additional elements are Ge and Be.

28. The fine gold alloy wire of claim 1 wherein said rare earth element is Sm and wherein said additional elements are Be and Ca.

29. The fine gold alloy wire of claim 1 wherein said rare earth element is Sm and wherein said additional elements are Ge and Ca.

30. The fine gold alloy wire of claim 1 wherein said rare earth element is Sm and wherein said additional elements are Ge Be and Ca.

31. The fine gold alloy wire of claim 1 wherein said rare earth elements are La and Nd.

32. The fine gold alloy wire of claim 1 wherein said rare earth elements are La and Sm.

33. The fine gold alloy wire of claim 1 wherein said rare earth elements are Ce and Pr.

34. The fine gold alloy wire of claim 1 wherein said rare earth elements are Ce and Nd.

35. The fine gold alloy wire of claim 1 wherein said rare earth elements are Ce and Sm.

36. The fine gold alloy wire of claim 1 wherein said rare earth elements are Pr and Nd.

37. The fine gold alloy wire of claim 1 wherein said rare earth elements are Pr and Sm.

38. The fine gold alloy wire of claim 1 wherein said rare earth elements are Nd and Sm.

39. The fine gold alloy wire of claim 1 wherein said rare earth elements are La, Ce, Pr, Nd and Sm.

40. A fine gold alloy wire for use in the bonding of semi-conductor elements characterized by having high tensile strength and consisting essentially of 0.0003 to less than 0.001 wt % of at least one rare earth element selected from the group consisting of La, Ce, Pr, Nd, Sm, Eu, Gd, Tb, Dy, Ho, Er, Tm, Lu, Sc and Y and 0.001 to 0.006 wt. % of at least one additional element selected from the group consisting of Ge, Be and Ca, with the balance being Au and incidental impurities.

41. The fine gold alloy wire of claim 40 which contains Ge as said additional element.

42. The fine gold alloy wire of claim 40 which contains Be as said additional element.

43. The fine gold alloy wire of claim 40 which contains Ca as said additional element.

44. The fine gold alloy wire of claim 40 which contains Ge and Be as said additional elements.

45. The fine gold alloy wire of claim 40 which contains Ge and Ca as said additional elements.

46. The fine gold alloy wire of claim 40 which contains Ca and Be as said additional elements.

47. The fine gold alloy wire of claim 40 which contains Ge, Be and Ca as said additional elements.

48. The fine gold alloy wire of claim 40 wherein said rare earth element is La.

49. The fine gold alloy wire of claim 40 wherein said rare earth element is Ce.

50. The fine gold alloy wire of claim 40 wherein said rare earth element is Pr.

51. The fine gold alloy wire of claim 40 wherein said rare earth element is Nd.

52. The fine gold alloy wire of claim 40 wherein said rare earth element is Sm.

53. The fine gold alloy wire of claim 40 wherein said rare earth elements are La and Ce.

54. The fine gold alloy wire of claim 40 wherein said rare earth elements are La and Pr.

55. The fine gold alloy wire of claim 40 wherein said rare earth elements are Pr and Sm.

56. The fine gold alloy wire of claim 40 wherein said rare earth elements are Ce, Pr, La and Nd.

57. A fine gold alloy wire for use in the bonding of semi-conductor elements characterized by having high tensile strength and consisting essentially of from 0.0003 to less than 0.01 wt % of Yb, with the balance being Au and incidental impurities.

58. A fine gold alloy wire for use in the bonding of semi-conductor elements characterized by having high tensile strength and consisting essentially of 0.0003 to less than 0.001 wt % of Yb, and 0.001 to 0.006 wt. % of at least one additional element selected from the group consisting of Ge, Be and Ca, with the balance being Au and incidental impurities.

* * * * *